(12) United States Patent
Reznicek et al.

(10) Patent No.: US 10,741,387 B1
(45) Date of Patent: Aug. 11, 2020

(54) HIGH PERCENTAGE SILICON GERMANIUM GRADED BUFFER LAYERS WITH LATTICE MATCHED GA(AS$_{1-y}$P$_y$) INTERLAYERS

(71) Applicant: International Business Machines Corporation, Armonk, NY (US)

(72) Inventors: Alexander Reznicek, Troy, NY (US); Stephen W. Bedell, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/270,232

(22) Filed: Feb. 7, 2019

(51) Int. Cl.
*H01L 21/02* (2006.01)
*H01L 29/267* (2006.01)
*H01L 29/66* (2006.01)

(52) U.S. Cl.
CPC .... *H01L 21/02507* (2013.01); *H01L 21/0245* (2013.01); *H01L 21/02381* (2013.01); *H01L 21/02387* (2013.01); *H01L 21/02392* (2013.01); *H01L 21/02395* (2013.01); *H01L 21/02455* (2013.01); *H01L 21/02461* (2013.01); *H01L 21/02463* (2013.01); *H01L 21/02532* (2013.01); *H01L 21/02538* (2013.01);
(Continued)

(58) Field of Classification Search
CPC ............ H01L 29/267; H01L 29/66318; H01L 29/66462; H01L 21/0245; H01L 21/02455; H01L 21/02461; H01L 21/02463; H01L 21/02381; H01L 21/02387; H01L 21/02392; H01L 21/02395; H01L 21/02532; H01L 21/02538; H01L 21/02543; H01L 21/02546; H01L 21/02507
See application file for complete search history.

(56) References Cited

U.S. PATENT DOCUMENTS

| 4,370,510 A | * | 1/1983 | Stirn | ............... H01L 31/022433 |
| | | | | 136/261 |
| 7,594,967 B2 | | 9/2009 | Vineis et al. | |

(Continued)

FOREIGN PATENT DOCUMENTS

| WO | 2004015749 A1 | 2/2004 |
| WO | 2017039547 A1 | 3/2007 |

OTHER PUBLICATIONS

Fitzgerald, E. A., "Dislocations in Relaxed SiGe/Si Heterostructures", Phys. Stat. Sol., Received Nov. 3, 1998, pp. 227-238, (a) 171.

*Primary Examiner* — Joseph C. Nicely
(74) *Attorney, Agent, or Firm* — Scully, Scott, Murphy & Presser, P.C.; L. Jeffrey Kelly, Esq.

(57) ABSTRACT

High germanium percentage (40 atomic percent or greater) silicon germanium (SiGe) graded buffer layers are provided in which stacking fault formation and dislocation defect density are drastically suppressed. Notably, a lattice matched heterogeneous semiconductor material interlayer of Ga(As$_{1-y}$ P$_y$) wherein y is from 0 to 1 is formed between each of the SiGe layers of the graded buffer layer to reduce the propagation of threading arm dislocation to the surface and inhibit the formation of stacking faults in each subsequent SiGe layer, and therewith drastically reduce the surface defect density.

20 Claims, 2 Drawing Sheets

(52) U.S. Cl.
CPC .. *H01L 21/02543* (2013.01); *H01L 21/02546* (2013.01); *H01L 29/267* (2013.01); *H01L 29/66318* (2013.01); *H01L 29/66462* (2013.01)

(56) References Cited

U.S. PATENT DOCUMENTS

| | | |
|---|---|---|
| 8,026,534 B2 | 9/2011 | Langdo et al. |
| 8,530,935 B2 * | 9/2013 | Yanagihara ......... H01L 29/7787 257/190 |
| 9,425,249 B2 | 8/2016 | Norman |
| 2006/0088966 A1 | 4/2006 | Tsai et al. |
| 2006/0234479 A1 * | 10/2006 | Liu ................... H01L 21/02381 438/483 |
| 2015/0325468 A1 * | 11/2015 | Zhang ............... H01L 21/76254 438/479 |
| 2016/0111286 A1 * | 4/2016 | Wen ................... H01L 27/0924 438/492 |
| 2016/0118255 A1 * | 4/2016 | Qi ...................... H01L 21/0245 438/479 |
| 2017/0288024 A1 * | 10/2017 | Reznicek ............... H01L 29/32 |
| 2018/0277629 A1 | 9/2018 | Lee et al. |

* cited by examiner

HIGH PERCENTAGE SILICON GERMANIUM GRADED BUFFER LAYERS WITH LATTICE MATCHED GA(AS$_{1-y}$P$_y$) INTERLAYERS

BACKGROUND

The present application relates to a silicon germanium (SiGe) graded buffer layer. More particularly, the present application relates to a SiGe graded buffer layer containing a high germanium percentage (40 atomic percent Ge or greater) in which stacking fault formation and threading arm dislocation density are drastically reduced.

Graded buffer layers (GBLs), also referred to as strain relaxed buffer layers (SRBs), are currently one of the front up approaches for 7 nm node and beyond technologies, enabling, for instance, dual channel material FinFETs or nanosheets on the same substrate. As an example, a topmost silicon germanium alloy (i.e., SiGe) of a GBL can be used for growing tensily-strained silicon (Si) channels for n-channel field effect transistors (i.e., nFETs), and compressively-stained germanium or high germanium percentage SiGe channels for p-channel field effect transistors (i.e., pFETs).

One of the biggest challenges with the process device yields of conventional GBLs is that the defect density at the surface of the GBL is in the $1\times10^5$ range even for the best known structures. This level of defect density is far too high to achieve high performance complementary metal oxide semiconductor (CMOS) fabrication. As such, a method is needed in which GBLs can be formed in which the defect density at the surface of each SiGe layer of a GBL is reduced to allow the GBLs to be employed in high performance CMOS fabrication.

In prior SiGe graded buffer layers, a first low percentage SiGe layer, often a 500-600 nm layer of 4-5% SiGe, grows fully strained onto a silicon substrate (compressive strain). Also the next layer, typically a 8-10% SiGe layer with a thickness of 500-600 nm, grows fully strained onto the underlying 4-5% SiGe layer. Both are fully strained since each of the SiGe layers is still below the critical thickness for such low germanium concentrations, even with their combined thickness of 1-1.2 micron. Once the 12% SiGe layer is grown and the higher percentage SiGe layers, the graded buffer layer starts to relax. Relaxation is accommodated by misfit dislocations at the interface between the two lattice mismatched semiconductor materials. The misfit dislocations lie at the interface, but have two threading arms (i.e. threading arm dislocations) that extend all the way to the surface. Threading arm dislocations are defects which are detrimental to devices build onto those GBL substrates. From each SiGe layer, two threading arm dislocations penetrate to the surface.

One way to reduce the threading arm dislocations is to grow the last SiGe layer of the target percentage thick, say 2-3 micron thick. This will lead to the annihilation of some of the threading arm dislocations. Also growing each of the strain relaxing SiGe layers thicker will reduce surface defect densities. The best 5 micron thick SiGe layers have defect densities of $1-2\times10^5$/cm$^2$. Increasing the thickness to 7-8 micron, defect densities of $4-7\times10^4$/cm$^2$ can be accomplished. What is needed, however, is defect numbers below 100/cm$^2$, with 1 to 0.1/cm$^2$ preferred. The above description applies to 20% SiGe graded buffer layers.

An additional problem is the formation of stacking faults. In a SiGe alloy containing 20 atomic percent Ge, the stacking fault density is low and negligible. However, SiGe graded buffer layers having a topmost SiGe layer having 25 atomic percent Ge or greater will have high dislocation defect densities and the formation of stacking faults will increase.

A way to reduce stacking fault formation and dislocation defect density is needed to facilitate the application of high germanium percentage SiGe graded buffer layers.

SUMMARY

High germanium percentage silicon germanium (SiGe) graded buffer layers are provided in which stacking fault formation and dislocation defect density are drastically reduced. The term "high germanium percent" denotes a SiGe alloy that contains 40 atomic percent or above germanium (Ge). Notably, a lattice matched heterogeneous semiconductor material interlayer of Ga(As$_{1-y}$P$_y$), wherein y is from 0 to 1, is formed between each of the SiGe layers of the graded buffer layer to reduce the propagation of threading arm dislocations to the surface and inhibit the formation of stacking faults in each subsequent SiGe layer, and therewith drastically reduce the surface defect density.

In one aspect of the present application, a SiG graded buffer layer is provided that includes a Ge-containing device layer having a germanium content of 40 atomic percent to 100 atomic percent. A stack of SiGe layers is located beneath the Ge-containing device layer. The stack of SiGe layers has a germanium content that increases from a bottommost SiGe layer to a topmost SiGe layer. An interlayer of Ga(As$_{1-y}$P$_y$), wherein y is from 0 to 1, is disposed between each SiGe layer of the stack of SiGe layers, and between the topmost SiGe layer and the Ge-containing device layer. In accordance with the present application, each interlayer of Ga(As$_{1-y}$P$_y$) is lattice matched to an underlying SiGe layer which the interlayer forms an interface with.

In one example, the SiGe buffer graded buffer layer includes a first lattice matched interlayer composed of GaP located on a first SiGe layer containing at least an uppermost portion having a germanium content of 10 atomic percent. A second SiGe layer containing at least an uppermost portion having a germanium content of 20 atomic percent is located on the first lattice matched interlayer. A second lattice matched interlayer composed Ga(As$_{1-y}$P$_y$), wherein y is 0.896 is located on the second SiGe layer. A third SiGe layer containing at least an uppermost portion having a germanium content of 30 atomic percent is located on the second lattice matched interlayer. A third lattice matched interlayer composed Ga(As$_{1-y}$P$_y$), wherein y is 0.792 is located on the third SiGe layer. A fourth SiGe layer containing at least an uppermost portion having a germanium content of 30 atomic percent is located on the third lattice matched interlayer. A fourth lattice matched interlayer composed Ga(As$_{1-y}$P$_y$), wherein y is 0.684 is located on the fourth SiGe layer. A SiGe containing device layer having a germanium content of 40 atomic percent is located on the fourth lattice matched interlayer. In accordance with the present application, the SiGe containing device layer is a relaxed layer and has a lower defect density than each of the first, second, third, and fourth SiGe layers.

DETAILED DESCRIPTION

Figure 1:
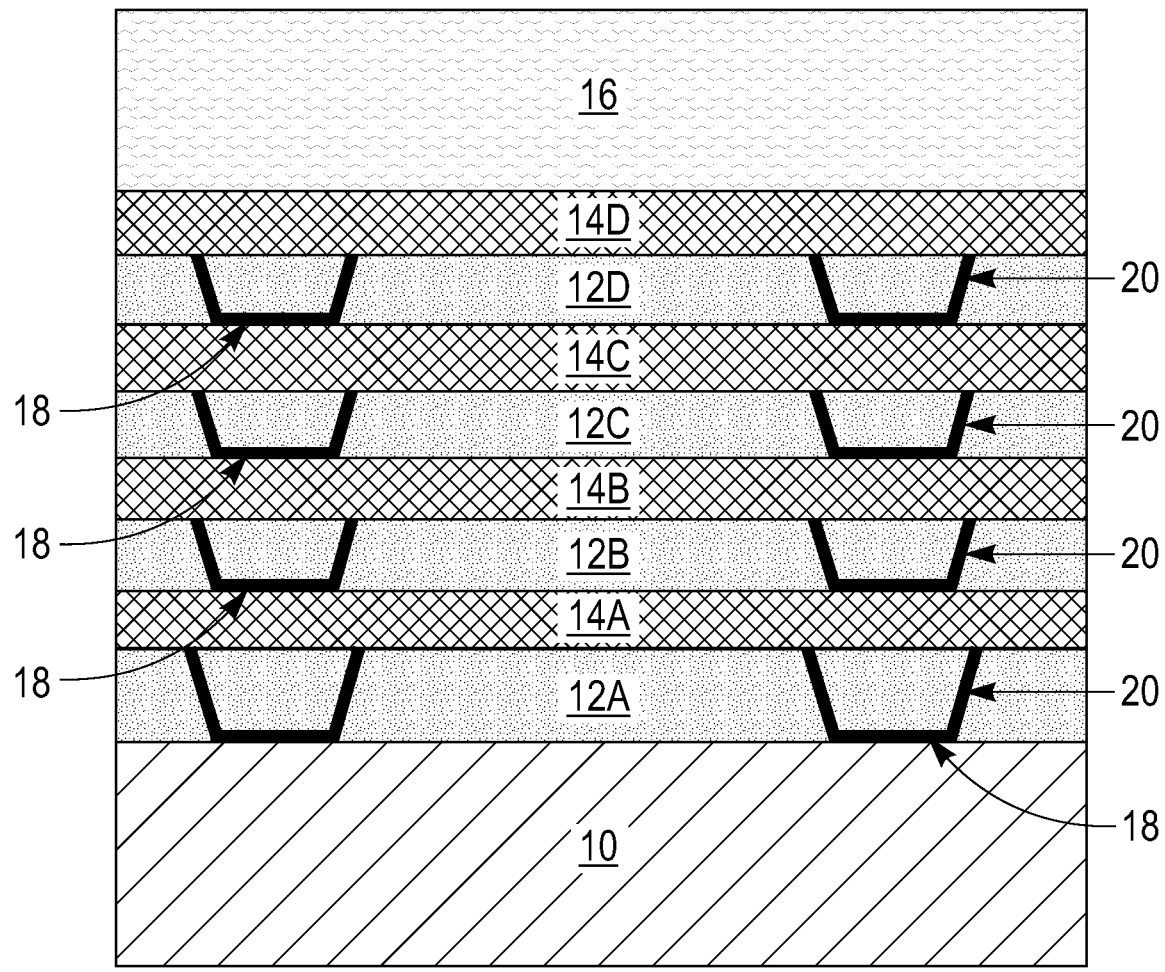
FIG. 1 is a cross sectional view of an exemplary silicon germanium graded buffer layer of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a way to form high germanium percentage (40 atomic percentage or greater Ge) SiGe graded buffer layers in which stacking fault formation and threading arm dislocation density are both drastically reduced. In the present application, a heterogeneous semiconductor material interlayer of $Ga(As_{1-y}P_y)$, wherein y is from 0 to 1 (including factions numbers between 0 and 1), is formed between each SiGe layer of a stack of SiGe layers, and between a topmost SiGe layer of the stack of SiGe layers and a Ge-containing device layer. In accordance with the present application, each interlayer of $Ga(As_{1-y}P_y)$ that is formed is lattice matched to an upper portion of an underlying SiGe layer which the interlayer forms an interface with. By "lattice matched" is meant the interlayer of $Ga(As_{1-y}P_y)$ has a lattice constant that is substantially the same (i.e., within ±0.5% or less of each other) as the lattice constant of the underlying SiGe layer of the stack of SiGe layers.

The formation of such lattice matched interlayers of $Ga(As_{1-y}P_y)$ within the SiGe graded buffer layer inhibits the propagation of the threading arm dislocations to the surface and thus drastically reduces stack fault formation and the surface defect density.

The lattice matched interlayers of $Ga(As_{1-y}P_y)$ that are employed in the present application will have no strain, forming a strain relaxed interlayer of a material with different atom radii, different unit cell and different bonding energies between the group III-metal (gallium) atoms and the Group V atom (phosphorus and/or arsenic). Since the interlayers of $Ga(As_{1-y}P_y)$ that are employed in the present application are strain-free, the interlayers of $Ga(As_{1-y}P_y)$ will immobilize threading arm dislocations, so the threading arm dislocations cannot move into the next SiGe layer nor can the threading arm dislocations multiply. This results in a reduction of threading arm dislocations, and the suppression of stacking fault formation in the overlying SiGe layer.

The interlayers of $Ga(As_{1-y}P_y)$ form low misfit strain regime (Ds<1%) between the strained SiGe layers. Since the difference in SiGe concentrations between the individual SiGe layers is small 5-10%, the strain in each of the interlayers of $Ga(As_{1-y}P_y)$ does not provide enough energy to form stacking faults in an overlying SiGe layer.

Referring now to FIG. 1, there is illustrated an exemplary SiGe graded buffer layer of the present application. Notably, FIG. 1 illustrates a SiGe graded buffer layer containing a high germanium percentage (i.e., 40 atomic percent up to, and including, 100 atomic percent). The SiGe graded buffer layer of FIG. 1, which is disposed on a silicon substrate 10, includes a Ge-containing device layer 16 having a germanium content of 40 atomic percent to 100 atomic percent; the remaining percentage up to 100 atomic percent of the Ge-containing device layer 16 is composed of Si. The SiGe graded buffer layer of FIG. 1 also includes a stack of SiGe layers (12A, 12B, 12C, 12D, etc.) located beneath the Ge-containing device layer 16; the SiGe layers within the stack of SiGe layers are non-device layers. In accordance with the present application, the stack of SiGe layers (12A, 12B, 12C, 12D, etc.) has a germanium content that increases from a bottommost SiGe layer (i.e., 12A as shown in the embodiment of FIG. 1) to a topmost SiGe layer (i.e., 12D as shown in the embodiment of FIG. 1).

An interlayer (14A, 14B, 14C, 14D, etc.) of $Ga(As_{1-y}P_y)$ wherein y is from 0 to 1 is disposed between each SiGe layer (12A, 12B, 12C, 12D, etc.) of the stack of SiGe layers, and between the topmost SiGe layer (i.e., 12D in the illustrated embodiment) and the Ge-containing device layer 16. In accordance with the present application, each interlayer of $Ga(As_{1-y}P_y)$ is lattice matched to an upper portion of an underlying SiGe layer which the interlayer forms an interface with. In the specific example shown in FIG. 1, interlayer 14A is lattice matched to the bottommost SiGe layer 12A of the stack of SiGe layers, interlayer 14B is lattice matched to SiGe layer 12B, interlayer 14C is lattice matched to SiGe layer 12C, and interlayer 14B is lattice matched to SiGe layer 12D. The Ge-containing device layer 16 is lattice matched to the topmost SiGe layer of the stack of SiGe layers.

Each lattice matched interlayer of $Ga(As_{1-y}P_y)$ suppresses (i.e., reduces) stacking fault formation and threading arm dislocation density in the SiGe layer which is located immediately above the lattice matched interlayer. Thus, the defect density within the SiGe graded buffer layer of the present application is drastically reduced from the bottommost SiGe layer of the stack of SiGe layers upwards to the Ge-containing device layer 16.

In the illustrated embodiment shown in FIG. 1, the SiGe graded buffer layer includes a stack that includes four SiGe layers (12A, 12B, 12C, 12D), and four lattice matched interlayers (14A, 14B, 14C, 14D). The SiGe graded buffer layer of the present application is not limited to the number of SiGe layers and lattice matched interlayers shown in the drawings of the present application. Instead, the SiGe graded buffer layer may include any number of SiGe layers and any number of lattice matched interlayers as long as one lattice matched interlayer is present on a SiGe layer.

In one embodiment, the germanium content of each individual SiGe layer (12A, 12B, 12C, 12D, etc.) of the stack of SiGe layers is uniform from bottom to top. In another embodiment, the germanium content of each individual SiGe layer (12A, 12B, 12C, 12D, etc.) of the stack of SiGe layers is graded from bottom to top. In another embodiment, the stack of SiGe layers may be step graded. By "step graded" it is meant that the content of germanium within the stack of SiGe layers increases in a non-abrupt manner from an interface with the silicon substrate 10. The silicon substrate 10 is typically single crystalline, and has any of the well known crystal orientations.

As mentioned above, the stack of SiGe layers (12A, 12B, 12C, 12D, etc.) has a germanium content that increases from a bottommost SiGe layer (12A as shown in the embodiment of FIG. 1) to a topmost SiGe layer (12D as shown in the embodiment of FIG. 1). Typically, the germanium content of each successive SiGe layer (12A, 12B, 12C, 12D, etc.) of the stack of SiGe layers differs by 5 atomic percent to 10 atomic percent. In one example and in accordance with the illustrated embodiment of FIG. 1, the bottommost (or first) SiGe layer 12A may have a germanium content from 5 atomic percent to 10 atomic percent, with the proviso that the uppermost portion of the bottommost SiGe layer 12A has a germanium content of 10 atomic percent, the second SiGe layer 12B may have a germanium content from 15 atomic percent to 20 atomic percent, the third SiGe layer 12C may have a germanium content from 25 atomic percent to 30 atomic percent, and the fourth SiGe layer 12D may have a germanium content from 35 atomic percent to 40 atomic percent. Although this specific example is provided, the present application is not limited to the same.

Each individual SiGe layer (12A, 12B, 12C, 12D, etc.) of the stack of SiGe layers may have a thickness from 500 nm to 2000 nm. In one example, each individual SiGe layer (12A, 12B, 12C, 12D, etc.) of the stack of SiGe layers has a thickness of about 1000 nm (the term "about" is used herein to denote that a value may vary within 10% of a given value). In some embodiments, the bottommost SiGe layer (12A) may have a thickness that is greater than the thickness of the other SiGe layers (i.e., 12B, 12C, 12D, etc.) of the stack of SiGe layers.

As mentioned above, an interlayer (14A, 14B, 14C, 14D, etc.) of $Ga(As_{1-y}P_y)$ is disposed between each SiGe layer (12A, 12B, 12C, 12D, etc.) of the stack of SiGe layers, and between the topmost SiGe layer (i.e., 12D in the illustrated embodiment) and the Ge-containing device layer 16. In accordance with the present application, each interlayer of $Ga(As_{1-y}P_y)$ is lattice matched, as defined above, to an upper portion of an underlying SiGe layer which the interlayer forms an interface with. For a SiGe alloy layer having 10 atomic percent germanium, GaP (i.e., a compound of $Ga(As_{1-y}P_y)$ wherein y=1) is used as a lattice matched interlayer. In SiGe layers having a higher Ge content than 10 atomic percent, the arsenic (As) content of the interlayer of $Ga(As_{1-y}P_y)$ must be increased to provide a lattice matched interlayer. Table I shows the stoichiometry for some exemplary lattice matched $Ga(As_{1-y}P_y)$ interlayers.

TABLE I

Stoichiometry for the lattice matched $Ga(As_{1-y}P_y)$ interlayers.

| Ge Content (atomic %) of SiGe | Lattice Constant (Å) of SiGe | y value for $Ga(As_{1-y}P_y)$ |
|---|---|---|
| 0 | 5.431 | 0 |
| 10 | 5.455 | 1 |
| 20 | 5.472 | 0.896 |
| 30 | 5.493 | 0.792 |
| 40 | 5.515 | 0.684 |
| 50 | 5.538 | 0.570 |
| 100 | 5.658 | 0 |

Each individual lattice matched interlayer (14A, 14B, 14C, 14D, etc.) may have a thickness from 10 nm to 250 nm.

The Ge-containing device layer 16 has a germanium content of 40 atomic percent to 100 atomic percent; the remainder up to 100 atomic percent is Si. The Ge-containing device layer 16 typically has the same Ge content as the uppermost portion of the topmost SiGe layer (e.g., 12D in FIG. 1) of the stack of SiGe layers. When the Ge-containing device layer 16 has a germanium content of 100 atomic percent, then the Ge-containing device layer 16 may be referred to a germanium device layer. When the Ge-containing device layer 16 has a germanium content of 40 atomic percent up to, but not including 100 atomic percent, then the Ge-containing device layer 16 may be referred to a SiGe device layer. The Ge-containing device layer 16 may have a thickness from 100 nm to 500 nm.

Each of the SiGe layers (12A, 12B, 12C, 12D, etc.) of the SiGe graded buffer layer of FIG. 1 is a relaxed layer. By "relaxed" it is meant that a material layer has a top portion with a different lattice constant than a bottom portion of the same material layer. Each of the $Ga(As_{1-y}P_y)$ interlayers (14A, 14B, 14C, 14D, etc.) and the Ge-containing device layer 16 are lattice matched. It is noted that during growth of the low Ge percentages SiGe layers within the described thickness range, the low Ge percentages will be stained, relaxation occurs with the growth of the higher Ge percentage SiGe layers. As previously explained, relaxation is accommodated by misfit dislocations formation and threading arm dislocation defects. Each of the SiGe layers (12A, 12B, 12C, 12D, etc.) of the stack of SiGe layers will contain misfit dislocations located within a bottom portion thereof. Each of the misfit dislocation defects contains threading arm dislocation defects that extend upward to the topmost surface of each of SiGe layers (12A, 12B, 12C, 12D, etc.). As mentioned above, the presence of the lattice matched interlayer drastically suppresses these defects from forming in an overlying SiGe layer.

The presence of the aforementioned defects is also shown in FIG. 1 of the present application. Notably, FIG. 1 illustrates misfit dislocation defects 18 and threading arm dislocation defects 20 present in the SiGe layers (12A, 12B, 12C, 12D, etc.) of the stack of SiGe layers that is located beneath the Ge-containing device layer 16 of the SiGe graded buffer layer; each misfit dislocation defect 18 includes a pair of threading arm dislocations that extend upward from each end of the misfit dislocation. In the present application, the threading arm dislocation defects are prevented from extending from one SiGe layer to the next as well as into to the Ge-containing device layer 16 due to the presence of the lattice matched interlayers (14A, 14B, 14C, 14D, etc.). Each of the interlayers of $Ga(As_{1-y}P_y)$ can be referred to as a defect barrier. Thus, the Ge-containing device layer 16 which has a high germanium content (40 atomic percent or greater) has a lower defect density than the SiGe layers (12A, 12B, 12C, 12D, etc.) of the stack of SiGe layers. In one embodiment, the defect density is less than 1000/cm$^2$. In another embodiment, the defect density is from 1/cm$^2$ to 100/cm$^2$. In some embodiment, no threading arm dislocation defects are present in the Ge-containing device layer 16.

In one specific example of a SiGe graded buffer layer in accordance with FIG. 1, the SiGe graded buffer layer includes a first lattice matched interlayer 14A composed of GaP located on a first SiGe layer 12A containing at least an uppermost portion having a germanium content of 10 atomic percent. A second SiGe layer 12B containing at least an uppermost portion having a germanium content of 20 atomic percent is located on the first lattice matched interlayer 14A. A second lattice matched interlayer 14B composed Ga ($As_{1-y}P_y$), wherein y is 0.896 is located on the second SiGe layer 12B. A third SiGe layer 12C containing at least an uppermost portion having a germanium content of 30 atomic percent is located on the second lattice matched interlayer 14B. A third lattice matched interlayer 14C composed Ga($As_{1-y}P_y$), wherein y is 0.792 is located on the third SiGe layer 12C. A fourth SiGe layer 12D containing at least an uppermost portion having a germanium content of 30 atomic percent is located on the third lattice matched interlayer 14C. A fourth lattice matched interlayer 14D composed Ga($As_{1-y}P_y$), wherein y is 0.684 is located on the fourth SiGe layer 12D. A SiGe containing device layer 16 having a germanium content of 40 atomic percent is located on the fourth lattice matched interlayer 14D. In accordance with the present application, the SiGe containing device layer is a relaxed layer and has a lower defect density than each of the first, second, third, and fourth SiGe layers.

The graded buffer layer of FIG. 1 can be formed utilizing an epitaxial growth process to form each of the SiGe layers (12A, 12B, 12C, 12D, etc.), each of the lattice matched interlayers (14A, 14B, 14C, 14D, etc.), and the Ge-containing device layer 16 that provide the SiGe graded buffer layer. In the present application, a vacuum is typically maintained between the epitaxial growth of the various layers of the SiGe graded buffer layer of the present application. In some embodiments, metal-organic CVD (MOCVD) may be used to form the lattice matched interlayers and an epitaxial growth process can be used to form the SiGe layers and the Ge-containing device layer 16' both processes can be done in the same tool or tool cluster, without breaking into air.

The terms "epitaxial growth and/or deposition" and "epitaxially formed and/or grown" mean the growth of a material on a deposition surface of a material, in which the material being grown has the same crystalline characteristics as the material of the deposition surface. In an epitaxial deposition process, the chemical reactants provided by the source gases are controlled and the system parameters are set so that the depositing atoms arrive at the deposition surface of the growth surface with sufficient energy to move around on the surface and orient themselves to the crystal arrangement of the atoms of the deposition surface. Therefore, an epitaxial material has the same crystalline characteristics as the deposition surface on which it is formed.

Examples of various epitaxial growth process apparatuses that are suitable for use in forming the graded buffer layer material stack 12 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

A number of different sources may be used for the deposition of the SiGe layers (12A, 12B, 12C, 12D, etc.). In some embodiments and, the source gas for the deposition of the SiGe layers (12A, 12B, 12C, 12D, etc.) may include an admixture of a silicon containing gas source and a germanium containing gas source. Examples of silicon gas sources include silane, disilane, trisilane, tetrasilane, hexachlorodisilane, tetrachlorosilane, dichlorosilane, trichlorosilane, and combinations thereof. Examples of germanium gas sources include germane, digermane, halogermane, dichlorogermane, trichlorogermane, tetrachlorogermane and combinations thereof. In some embodiments, the SiGe layers (12A, 12B, 12C, 12D, etc.) can be formed from a source gas that includes a compound containing silicon and germanium. Other source gases or gases mixtures that are known to those skilled in the art can also be used in forming the SiGe layers (12A, 12B, 12C, 12D, etc.). Carrier gases like hydrogen, nitrogen, helium and argon can be used.

A number of different sources may be used for the deposition of the lattice matched interlayers (14A, 14B, 14C, 14D, etc.) of Ga($As_{1-y}P_y$). The type of sources that can be used in forming the lattice matched interlayers (14A, 14B, 14C, 14D, etc.) may vary depending on the type of compound that needs to be formed. For example, when a lattice matched interlayer of GaP is to be formed, a combination of trimethylgallium as a gallium source and tertiarybutylphosphine (TBP) or phosphine ($PH_3$) can be used. When a lattice matched interlayer of Ga($As_{1-y}P_y$) wherein y is not 0 is to be formed, a combination of trimethylgallium as a gallium source and tertiarybutylphosphine (TBP) or phosphine ($PH_3$) mixed with tertiarybutylarsine (TBAs) or arsine ($AsH_3$) can be used. When a lattice matched interlayer of GaAs is to be formed, a combination of trimethylgallium as a gallium source and tertiarybutylarsine (TBAs) or arsine ($AsH_3$) can be used.

A number of different sources may be used for the deposition of the Ge-containing device layer 16. When the Ge-containing device is composed of SiGe one of the sources mentioned above for the SiGe layers can be used. When the Ge-containing device is composed of Ge, then germanium or digermane can be used.

Figure 2:
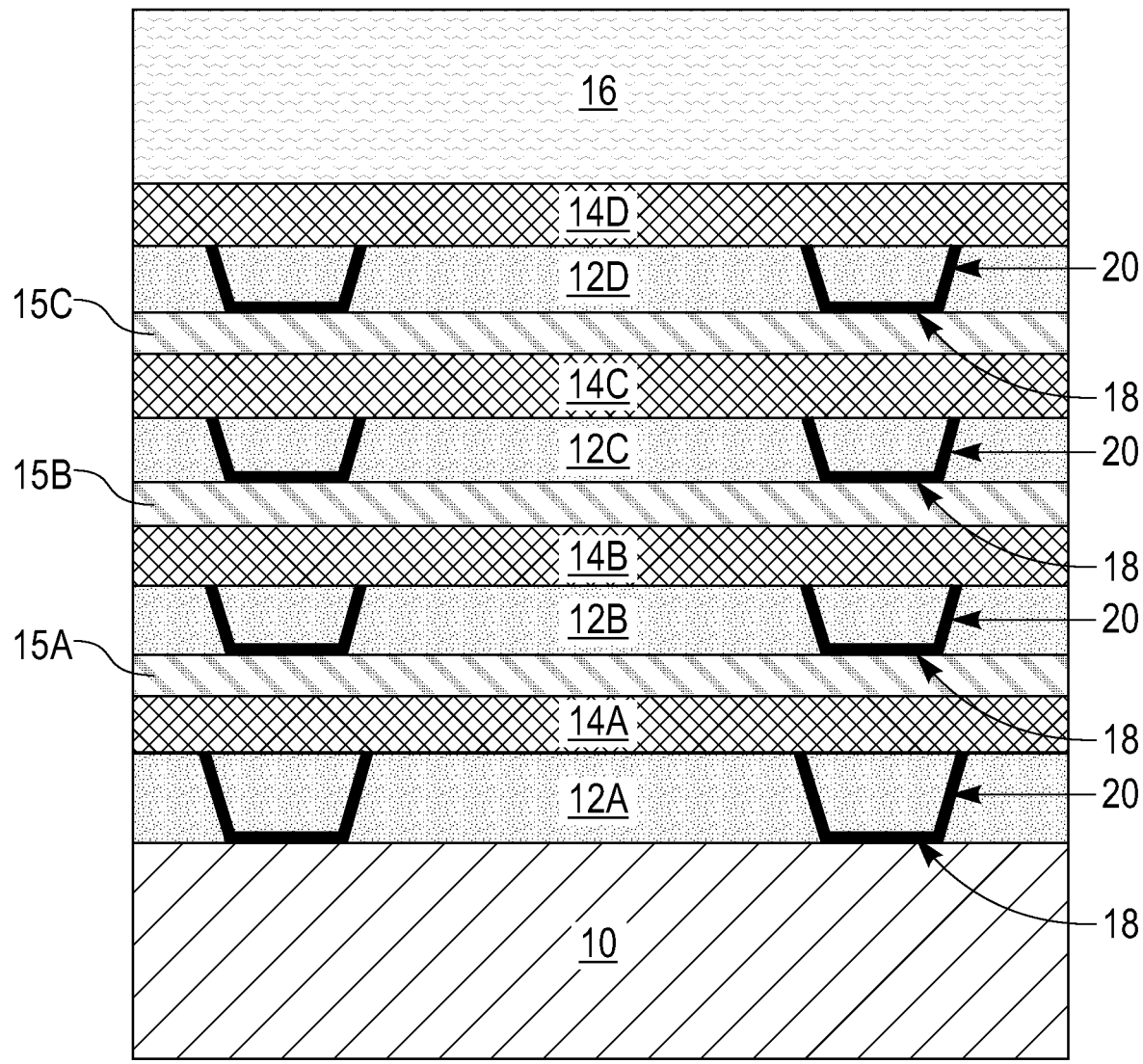
FIG. 2 is a cross sectional view of another exemplary silicon germanium graded buffer layer of the present application.

Referring now to FIG. 2, there is illustrated another exemplary semiconductor (i.e., SiGe) graded buffer layer of the present application. This embodiment of the present application is similar to the embodiment described above in connection with providing the SiGe graded buffer layer shown in FIG. 1, except that a dislocation movement barrier (15A, 15B, 15C, etc.) of tensile SiGe is disposed between each lattice matched interlayer and each SiGe layer of the stack of SiGe layers. Each dislocation movement barrier (15A, 15B, 15C, etc.) of tensile SiGe forms a first interface with a lattice interlayer and a second interface, that is opposite to the first interface, with one of the overlying SiGe layers of the stack of SiGe layers that is located above the lattice matched interlayer. Each dislocation movement barrier (15A, 15B, 15C, etc.) of tensile SiGe has a 2 atomic percent to 3 atomic percent less germanium content than the overlying SiGe layer that it forms an interface with.

Each dislocation movement barrier (15A, 15B, 15C, etc.) of tensile SiGe has a thickness from 20 nm to 100 nm. Each dislocation movement barrier (15A, 15B, 15C, etc.) of tensile SiGe can be formed utilizing an epitaxial growth process in which one of the sources mentioned above for the SiGe layers of the stack of SiGe layers is employed.

In one specific example of a SiGe graded buffer layer in accordance with FIG. 2, the SiGe graded buffer layer includes a first lattice matched interlayer 14A composed of GaP is located on a first SiGe layer 12A containing at least an uppermost portion having a germanium content of 10 atomic percent. A first dislocation movement barrier 15A of tensile SiGe having a germanium content of 8 atomic percent is located on the first lattice matched interlayer 14A. A second SiGe layer 12B containing at least an uppermost portion having a germanium content of 20 atomic percent is located on the first dislocation movement barrier 15A. A second lattice matched interlayer 14B composed Ga($As_{1-y}P_y$), wherein y is 0.896 is located on the second SiGe layer 12B. A second dislocation movement barrier 15B of tensile SiGe having a germanium content of 18 atomic percent is located on the second lattice matched interlayer 14B. A third SiGe layer 12C containing at least an uppermost portion having a germanium content of 30 atomic percent is located on the second dislocation movement barrier 15B. A third lattice matched interlayer 14C composed Ga(As$_{1-y}$P$_y$), wherein y is 0.792 is located on the third SiGe layer 14C. A third dislocation movement barrier 15C of tensile SiGe having a germanium content of 28 atomic percent is located on the third lattice matched interlayer 14C. A fourth SiGe layer 12D containing at least an uppermost portion having a germanium content of 30 atomic percent is located on the third dislocation barrier material 15C. A fourth lattice matched interlayer 14D composed Ga(As$_{1-y}$P$_y$), wherein y is 0.684 is located on the fourth SiGe layer 12D. A SiGe containing device layer 16 having a germanium content of 40 atomic percent is located on the fourth lattice matched interlayer 14D. In accordance with the present application, the SiGe containing device layer is a relaxed layer and has a lower defect density than each of the first, second, third, and fourth SiGe layers.

In this embodiment, the present of the dislocation movement barriers of tensile SiGe provides an additional barrier that will suppress the formation and/or propagation of defects within the SiGe graded buffer layer of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A silicon germanium (SiGe) graded buffer layer comprising:
   a Ge-containing device layer having a germanium content of 40 atomic percent to 100 atomic percent;
   a stack of SiGe layers located beneath the Ge-containing device layer, wherein the stack of SiGe layers has a germanium content that increases from a bottommost SiGe layer to a topmost SiGe layer; and
   an interlayer of Ga(As$_{1-y}$P$_y$), wherein y is from 0 to 1, disposed between each SiGe layer of the stack of SiGe layers, and between the topmost SiGe layer and the Ge-containing device layer, wherein each interlayer of Ga(As$_{1-y}$P$_y$) is lattice matched to an underlying SiGe layer which the interlayer forms an interface with.

2. The SiGe graded buffer layer of claim 1, wherein each interlayer of Ga(As$_{1-y}$P$_y$) reduces stacking fault formation and threading arm dislocation density of an overlying SiGe layer of the stack of SiGe layers and a topmost interlayer of Ga(As$_{1-y}$P$_y$) reduces stacking fault formation and threading arm dislocation density of the Ge-containing device layer.

3. The SiGe graded buffer layer of claim 1, wherein the germanium content of each SiGe layer of the stack of SiGe layers is uniform.

4. The SiGe graded buffer layer of claim 1, wherein the germanium content of each SiGe layer of the stack of SiGe layers is graded.

5. The SiGe graded buffer layer of claim 1, wherein the germanium content of the stack of SiGe layers is step graded.

6. The SiGe graded buffer layer of claim 1, wherein the germanium content of each successive SiGe layer of the stack of SiGe layers differs by 5 atomic percent to 10 atomic percent.

7. The SiGe graded buffer layer of claim 6, wherein the bottommost SiGe layer of the stack of SiGe layers has at least an uppermost portion that has a germanium content of 10 atomic percent, and wherein the interlayer of Ga(As$_{1-y}$P$_y$) disposed on the bottommost SiGe is composed of gallium phosphide (GaP).

8. The SiGe graded buffer layer of claim 7, wherein the topmost SiGe layer of the stack of SiGe layers has at least an uppermost portion that has a germanium content of 40 atomic percent, the germanium content of the Ge-containing device layer is also 40 atomic percent, and wherein the interlayer of Ga(As$_{1-y}$P$_y$) disposed between the topmost SiGe layer of the stack of SiGe layers and the Ge-containing device layer is Ga(As$_{1-y}$P$_y$), wherein y is 0.684.

9. The SiGe graded buffer layer of claim 1, wherein the Ge-containing device layer has a lower defect density than each of the SiGe layers of the stack of SiGe layers.

10. The SiGe graded buffer layer of claim 1, further comprising misfit dislocations present at a bottom portion of each SiGe layer of the stack of SiGe layers.

11. The SiGe graded buffer layer of claim 10, further comprising threading arm dislocations present in each SiGe layer, wherein each threading arm dislocation extends upward from each misfit dislocation and terminates at a bottommost surface of one of the overlying interlayers of Ga(As$_{1-y}$P$_y$).

12. The SiGe graded buffer layer of claim 1, further comprising a dislocation movement barrier of tensile SiGe located between each interlayer of Ga(As$_{1-y}$P$_y$) and an overlying SiGe layer.

13. The SiGe graded buffer layer of claim 12, wherein each dislocation movement barrier of tensile SiGe has a 2 atomic percent to 3 atomic percent less germanium content than the overlying SiGe layer that it forms an interface with.

14. The SiGe graded buffer layer of claim 1, further comprising a silicon semiconductor substrate located beneath the bottommost SiGe layer of the stack of SiGe layers.

15. The SiGe graded buffer layer of claim 1, wherein the Ge-containing device layer is a SiGe alloy containing from 40 atomic percent up to, but not including, 100 atomic germanium.

16. A silicon germanium (SiGe) graded buffer layer comprising:
   a first lattice matched interlayer composed of GaP located on a first SiGe layer containing at least an uppermost portion having a germanium content of 10 atomic percent;
   a second SiGe layer containing at least an uppermost portion having a germanium content of 20 atomic percent located on the first lattice matched interlayer;
   a second lattice matched interlayer composed Ga(As$_{1-y}$P$_y$), wherein y is 0.896 located on the second SiGe layer,
   a third SiGe layer containing at least an uppermost portion having a germanium content of 30 atomic percent located on the second lattice matched interlayer;
   a third lattice matched interlayer composed Ga(As$_{1-y}$P$_y$), wherein y is 0.792 located on the third SiGe layer,
   a fourth SiGe layer containing at least an uppermost portion having a germanium content of 30 atomic percent located on the third lattice matched interlayer;

a fourth lattice matched interlayer composed $Ga(As_{1-y}P_y)$, wherein y is 0.684 located on the fourth SiGe layer; and a SiGe containing device layer having a germanium content of 40 atomic percent located on the fourth lattice matched interlayer, wherein the SiGe containing device layer is a relaxed layer and has a lower defect density than each of the first, second, third, and fourth SiGe layers.

17. The SiGe graded buffer layer of claim 16, wherein each lattice matched interlayer of $Ga(As_{1-y}P_y)$ reduces stacking fault formation and threading arm dislocation density of an overlying SiGe layer of the stack of SiGe layers and a topmost lattice matched interlayer of $Ga(As_{1-y}P_y)$ reduces stacking fault formation and threading arm dislocation density of the SiGe containing device layer.

18. The SiGe graded buffer layer of claim 17, further comprising:

a first dislocation movement barrier of tensile SiGe having a germanium content of 8 atomic percent located between the first lattice matched interlayer and the second SiGe layer;

a second dislocation movement barrier of tensile SiGe having a germanium content of 18 atomic percent located between the second lattice matched interlayer and the third SiGe layer; and a third dislocation movement barrier of tensile SiGe having a germanium content of 28 atomic percent located between the third lattice matched interlayer and the fourth SiGe layer.

19. The SiGe graded buffer layer of claim 16, further comprising misfit dislocations present at a bottom portion of each of the first, second, third, and fourth SiGe layers.

20. The SiGe graded buffer layer of claim 19, further comprising threading arm dislocations extending upward from each misfit dislocation and terminating at a bottommost surface of one of the lattice matched interlayers.

* * * * *